(12) United States Patent
Yang

(10) Patent No.: US 7,783,465 B2  
(45) Date of Patent: Aug. 24, 2010

(54) PARALLEL MULTI-RATE CIRCUIT SIMULATION

(75) Inventor: Baolin Yang, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 642 days.

(21) Appl. No.: 11/612,335

(22) Filed: Dec. 18, 2006

(65) Prior Publication Data

US 2007/0157135 A1 Jul. 5, 2007

Related U.S. Application Data

(60) Provisional application No. 60/752,217, filed on Dec. 19, 2005, provisional application No. 60/789,376, filed on Apr. 4, 2006.

(51) Int. Cl.
*G06F 17/50* (2006.01)

(52) U.S. Cl. .................................................. 703/14

(58) Field of Classification Search .............. 703/2, 703/14; 714/741; 717/140; 716/5, 4; 702/57
See application file for complete search history.

(56) References Cited

U.S. PATENT DOCUMENTS

| | | | | |
|---|---|---|---|---|
| 6,154,716 | A * | 11/2000 | Lee | ................................ 703/2 |
| 6,507,410 | B1 | 1/2003 | Robertson et al. | |
| 6,530,065 | B1 | 3/2003 | McDonald et al. | |
| 7,539,602 | B2 * | 5/2009 | Willis | ............................... 703/2 |
| 2003/0097246 | A1 | 5/2003 | Hara et al. | |
| 2004/0176992 | A1 | 9/2004 | Santos et al. | |
| 2004/0268283 | A1 | 12/2004 | Perry et al. | |
| 2005/0028081 | A1 | 2/2005 | Arcuri et al. | |
| 2005/0076318 | A1 | 4/2005 | Croix et al. | |
| 2005/0273298 | A1 * | 12/2005 | Shah | ............................ 703/2 |
| 2006/0031794 | A1 * | 2/2006 | Li et al. | ......................... 716/4 |
| 2006/0074843 | A1 | 4/2006 | Pereira | |
| 2006/0095218 | A1 * | 5/2006 | Sagesaka et al. | ............... 702/57 |
| 2006/0248518 | A1 * | 11/2006 | Kundert | ...................... 717/140 |
| 2007/0079205 | A1 * | 4/2007 | Jeng et al. | ................... 714/741 |
| 2007/0124707 | A1 * | 5/2007 | Sutjahjo et al. | ................ 716/4 |
| 2009/0132975 | A1 * | 5/2009 | Cheng et al. | .................... 716/5 |

OTHER PUBLICATIONS

Basermann et al., "*Preconditioning Parallel Sparse Iterative Solvers for Circuit Simulation*", Mar. 2003, C&C Research Labs, NEC Europe Ltd., Germany; High-End Design Technology Dev. Grp. Tech. Foundation Dev. Div., NEC Electronics Corp., Japan.

(Continued)

*Primary Examiner*—Paul L Rodriguez
*Assistant Examiner*—Kandasamy Thangavelu
(74) *Attorney, Agent, or Firm*—Bever, Hoffman & Harms, LLP; Jeanette S. Harms

(57) ABSTRACT

A computer-implemented method for solving parallel equations in a circuit simulation is described. The method includes partitioning a circuit Jacobian matrix into loosely coupled partitions, reordering the voltage vector and the matrix according to the partitions, and splitting the Jacobian matrix into two matrices M and N, where M is a matrix suitable for parallel processing and N is a coupling matrix. M and N are then preconditioned to form $M^{-1}Jx=(I+M^{-1}N)x=M^{-1}r$ and the Jacobian matrix J is solved using an iterative solving method.

45 Claims, 12 Drawing Sheets

OTHER PUBLICATIONS

Saad et al., "*BILUTM: A Domain-Based Multi-Level Block ILUT Preconditioner for General Sparse Matrices*", Jun. 1998, pp. 1-20, Dept. of Computer Science &Eng., Univ. of MN, Minneapolis, MN.

Schilders, "*Iterative Solution of Linear Systems in Circuit Simulation*", Feb. 2001, Philips Research, IC Design/Digital Design and Test, & Scientific Computing Group, Eindhoven University of Technology, The Netherlands, w.h.a.schilders@tue.nl.

Saad, "*Multilevel ILU with reorderings for diagonal dominance*", Nov. 2004, Dept. of Computer Science & Eng., Univ. of MN, Minneapolis, MN, saad@cs.umn.edu.

Yang et al. "Time-Domain Steady-State Simulation of Frequency-Dependent Components Using Multi-Interval Chebyshev Method", Proceedings—Design Automation Conference, IEEE, New Orleans, LA, USA, Jun. 10-14, 2002, pp. 504-509.

Klinger, Volkhard "DiPaCS: a New Concept for Parallel Circuit Simulation", Proceedings of the 28th Annual Simulation Symposium, Phoenix, AZ, USA, Apr. 9-13, 1995, pp. 32-41.

Hu et al. "Fast-Yet-Accurate PVT Simulation by Combined Direct and Iterative Methods", IEEE/ACM International Conference on Computer-Aided Design, Piscataway, NJ, USA, Nov. 6-10, 2005, pp. 495-501.

Li et al. "CLUCGS and CLUCR—Two Matrix Solution Methods for General Circuit Simulation", Proceedings of the 34th Annual Simulation Symposium, Piscataway, NJ, USA, Apr. 22-26, 2001, pp. 78-82.

* cited by examiner $$J_r = \begin{bmatrix} A_1 & & & & C_1 \\ & A_2 & & & C_2 \\ & & A_3 & & C_3 \\ & & & \ddots & \vdots \\ D_1 & D_2 & D_3 & \cdots & A_m \end{bmatrix}$$

$$J_{example} = \begin{bmatrix} 1.1 & 0 & 0 & 1.4 \\ 0 & 2.2 & 2.3 & 0 \\ 0 & 0 & 3.3 & 3.4 \\ 4.1 & 0 & 0 & 4.4 \end{bmatrix}$$

$$J_{S\,example} = \begin{bmatrix} 1.1 & 0 & 0 & 4.1 \\ 0 & 2.2 & 2.3 & 0 \\ 0 & 2.3 & 3.3 & 3.4 \\ 4.1 & 0 & 3.4 & 4.4 \end{bmatrix}$$

$$J_{example} = \begin{bmatrix} 1.1 & 1.4 & & \\ 4.1 & 4.4 & & \\ & & 2.2 & 2.3 \\ 3.4 & & 3.2 & 3.3 \end{bmatrix}$$

FIG. 7

$$M_{example} = \begin{bmatrix} 1.1 & 1.4 & & \\ 4.1 & 4.4 & & \\ & & 2.2 & 2.3 \\ & & 3.2 & 3.3 \end{bmatrix}, N_{example} = \begin{bmatrix} 0 & & & \\ & 0 & & \\ & & & 0 \\ 3.4 & & & 0 \end{bmatrix}$$

FIG. 8A $$M_{example} = \begin{bmatrix} 1.1 & 1.4 & & \\ 4.1 & 4.4 & & \\ & & 2.2 & 2.3 \\ 3.4 & & 3.2 & 3.3 \end{bmatrix}, N_{example} = \begin{bmatrix} 0 & & & \\ & 0 & & \\ & & & 0 \\ & & & 0 \end{bmatrix}$$

FIG. 8B $$\begin{bmatrix} A_{11}^{I} & A_{12}^{I} & A_{13}^{I} & & & & & & C_{11} & & C_{12} & & \\ A_{21}^{I} & A_{22}^{I} & A_{23}^{I} & & & & & & & & & & \\ A_{31}^{I} & A_{32}^{I} & A_{33}^{I} & & & & & & C_{21} & & & & \\ & & & A_{11}^{II} & A_{12}^{II} & A_{13}^{II} & & & & & & & \\ & & & A_{21}^{II} & A_{22}^{II} & A_{23}^{II} & & & & & C_{22} & & \\ & & & A_{31}^{II} & A_{32}^{II} & A_{33}^{II} & & & & & & & \\ & & & & & & A_{11}^{III} & A_{12}^{III} & A_{13}^{III} & & & & \\ & & & & & & A_{21}^{III} & A_{22}^{III} & A_{23}^{III} & & & & \\ & & & & & & A_{31}^{III} & A_{32}^{III} & A_{33}^{III} & & & & \\ & & & & & & & & & A_{11}^{IV} & A_{12}^{IV} & A_{13}^{IV} \\ & & & & & & C_{51} & & & A_{21}^{IV} & A_{22}^{IV} & A_{23}^{IV} \\ & B_{*} & B_{*} & B_{*} & & & & & & A_{31}^{IV} & A_{32}^{IV} & A_{33}^{IV} \end{bmatrix}$$

FIG. 9

$$N = \begin{bmatrix} 0 & & & & & & & & C_{11} & & C_{12} \\ & 0 & & & & & & & & & \\ & & 0 & & & & & C_{21} & & & \\ & & & 0 & & & & & & & \\ & & & & 0 & & & & & & C_{22} \\ & & & & & 0 & & & & & \\ & & & & & & 0 & A_{12}^{III} & & & \\ & & & & & & & 0 & & & \\ & & & & & & A_{32}^{III} & & 0 & & \\ & & & & & & & & 0 & & A_{12}^{IV} \\ & & & & & & & C_{51} & & 0 & \\ & & & & & & & & & A_{32}^{IV} & 0 \end{bmatrix}$$

FIG. 10A $$M = \begin{bmatrix} A_{11}^{I} & A_{12}^{I} & A_{13}^{I} & & & & & & & 0 & & & 0 \\ A_{21}^{I} & A_{22}^{I} & A_{23}^{I} & & & & & & & & & & \\ A_{31}^{I} & A_{32}^{I} & A_{33}^{I} & & & & & & & 0 & & & \\ & & & A_{11}^{II} & A_{12}^{II} & A_{13}^{II} & & & & & & & \\ & & & A_{21}^{II} & A_{22}^{II} & A_{23}^{II} & & & & & & 0 & \\ & & & A_{31}^{II} & A_{32}^{II} & A_{33}^{II} & & & & & & & \\ & & & & & & A_{11}^{III} & 0 & A_{13}^{III} & & & & \\ & & & & & & A_{21}^{III} & A_{22}^{III} & A_{23}^{III} & & & & \\ & & & & & & A_{31}^{III} & 0 & A_{33}^{III} & & & & \\ & & & & & & & & & A_{11}^{IV} & 0 & A_{13}^{IV} & \\ & & & & & & & 0 & & A_{21}^{IV} & A_{22}^{IV} & A_{23}^{IV} & \\ & & & B_* & B_* & B_* & & & & A_{31}^{IV} & 0 & A_{33}^{IV} & \end{bmatrix}$$

FIG. 10B $$\begin{bmatrix} 1 & & & & & & & & * & * & \\ & 1 & & & & & & & * & * & \\ & & 1 & & & & & & * & * & \\ & & & 1 & & & & & * & * & \\ & & & & 1 & & & & * & * & \\ & & & & & 1 & & & * & * & \\ & & & & & & 1 & & * & * & \\ & & & & & & & 1 & * & * & \\ & & & & & & & & S_{11} & S_{12} & \\ & & & & & & & & * & 1 & * \\ & & & & & & & & S_{21} & S_{22} & \\ & & & & & & & & * & * & 1 \end{bmatrix}$$

FIG. 11

$$M = \begin{bmatrix} 1.1 & 0 & 0 & 0 \\ 0 & 2.2 & 2.3 & 0 \\ 0 & 0 & 3.3 & 0 \\ 4.1 & 0 & 0 & 4.4 \end{bmatrix}, N = \begin{bmatrix} 0 & 0 & 0 & 1.4 \\ 0 & 0 & 0 & 0 \\ 0 & 0 & 0 & 3.4 \\ 0 & 0 & 0 & 0 \end{bmatrix}.$$

PARALLEL MULTI-RATE CIRCUIT SIMULATION

CLAIM OF PRIORITY

This Application claims the benefit of U.S. Provisional Patent Application No. 60/752,217 entitled "Parallel Multi-Rate Circuit Simulation," filed on Dec. 19, 2005 and U.S. Provisional Patent Application No. 60/789,376 also entitled "Parallel Multi-Rate Circuit Simulation," filed Apr. 4, 2006, both provisional applications being incorporated herein by reference in their entireties.

BACKGROUND

In Electronic Design Automation (EDA), software is developed that integrated circuit designers can use to explore and verify their designs. As the semiconductor industry enters the nanometer era, designers need to use EDA tools to check nanometer effects in the circuit to be manufactured. Without design verification, the manufactured integrated circuits have a high chance of malfunction, which leads to expensive re-spins and re-designs.

Circuit simulation is the most accurate way of verifying whether a circuit design works or not. FIG. 1 shows a flow diagram 50 illustrating typical transformations performed in manufacturing a circuit from the time an initial design is realized. Block 52 represents an initial circuit design. This design is broken down into a series of connected device elements 54. Each device element in the design is modeled with accurate analytical models that have been verified by foundries and fabricators. With device elements represented by analytical models, the voltage and current values can be simulated over a period of time by a circuit simulator, represented by dashed block 55. The circuit simulator 55 comprises a computer system programmed to perform circuit simulation operations on data. In circuit simulation, the voltage and current values at all the nodes in the circuit can be obtained by solving a system of differential or algebraic equations (DAE) represented in block 56 of flow diagram 50.

The DAE can be discretized using a finite-difference method and a nonlinear iterative method such as the Newton-Raphson method is used to solve the equations in an iterative process. In each iteration, the nonlinear equations are linearized around a previously obtained solution to produce the linearized system of equations represented in block 58. Then, the linear system needs to be solved.

Matrix solving techniques have widespread use in many scientific and engineering areas. In EDA, matrix solving techniques are essential in areas such as circuit simulation for solving the linear system of equations.

Circuit equations have the following form:

$$\frac{d Q(v)}{dt} + i(v) + u_0 = 0 \quad \text{(Eq. 1)}$$

where v is the vector of voltages at all nodes to be simulated in the circuit, Q(v) is the charge at these nodes, i(v) is the current at these nodes, and $u_0$ is the sources in the circuit.

In solving the above equations, the differentiation operator is first approximated with a finite-difference method. For illustration purpose, the backward Euler method will be described. However, other methods can be applied the same way if other finite-difference methods are used. The discretized system of equations has the following form:

$$\frac{Q|_{t_{m+1}} - Q|_{t_m}}{t_{m+1} - t_m} + i(v) + u_0 = 0 \quad \text{(Eq. 2)}$$

where the solution at time step $t_m$ is assumed to be known, and the solution at time $t_{m+1}$ is to be obtained. The Newton-Raphson iterative method can then be applied to solve the nonlinear discretized equations. In the iterative process, an initial guess $v^0$ is given. Then, a sequence of solutions $v^1$, $v^2$, ... are obtained that converge at the solution of the nonlinear equations as shown in the graph shown in FIG. 2. In every iteration, the nonlinear equations are linearized around the known solution, $v^n$, obtained in the previous iteration. Then, the following linear system of equations is solved to obtain $\Delta v$:

$$J \Delta v = r \quad \text{(Eq. 3)}$$

where:

$$\Delta v = v^{n+1} - v^n, \quad \text{(Eq. 3a)}$$

$$J = \frac{1}{t_{m+1} - t_m} \frac{\partial Q}{\partial v} + \frac{\partial i}{\partial v}, \text{ and} \quad \text{(Eq. 3b)}$$

$$r = -\left(\frac{Q(v^n)|_{t_{m+1}} - Q(v^n)|_{t_m}}{t_{m+1} - t_m} + i(v^n) + u_0\right). \quad \text{(Eq. 3c)}$$

After $\Delta v$ is obtained, the updated solution $v^{n+1} = v^n + \Delta v$ is obtained. The process is continued until $$|\Delta v| < \text{tol} \quad \text{(Eq. 4)}$$

where tol is some small error tolerance. When the condition of Equation 4 is satisfied, the solution is considered to have converged as shown in FIG. 2, giving the solution at $t_{m+1}$:

$$v|_{t_{m+1}} = v^{n+1}. \quad \text{(Eq. 5)}$$

In traditional Spice circuit simulation, the error checking is performed for all node voltages and $|\Delta v|$ is the maximum absolute value of all entries in the vector $\Delta v$, i.e. solution change at all nodes. When equation 4 is satisfied, then the procedure advances one time step and returns to block 56 of flowchart 50 to solve the next system of nonlinear equations corresponding to the next moment in time. In this manner, transient fluctuations in the modeled circuit can be simulated.

The voltage values generated at each time are analyzed to determine if the circuit simulation matches the expected operation of the circuit. For example, the voltage values may be compared with logical analysis of the circuit design. For another example, the voltage and current values can be used to perform power or timing analysis of the circuit design. If, at operation 68, the simulation fails to match the expected operation, then the design is modified to correct the deficiencies, and procedure returns to operation 52 with a new circuit design. However, if the voltages compare favorably with expected operations, then the circuit design is prototyped, i.e., a manufactured circuit 70 is produced.

The major part in solving the linear system is solving the circuit Jacobian matrix matrix, which includes an LU decomposition step and a forward and backward substitution step in a traditional direct approach. Fast and accurate matrix solution is very important in fast and accurate circuit simulation.

Matrix solving techniques can be divided into two categories. One category is called direct matrix solving method. The other category is called iterative matrix solving method.

Consider the following linear system in circuit simulation:

$$J\Delta v = r \quad \text{(Eq. 6)}$$

where J is the circuit Jacobian matrix, r is the residual vector, and $\Delta v$ is the vector of node voltage solution update.

Direct matrix solver does an LU decomposition of matrix J first:

$$J = LU, \quad \text{(Eq. 7)}$$

where L is a lower triangular matrix and U is a upper triangular matrix. Then we can solve:

$$L \cdot y = r \quad \text{(Eq. 8)}$$

and $$U \cdot \Delta v = y \quad \text{(Eq. 9)}$$

to obtain the solution, $\Delta v$, to the linear system. In the following description, x is used to represent $\Delta v$ for convenience:

$$x \equiv \Delta v. \quad \text{(Eq. 10)}$$

Iterative matrix solver tries to obtain or approach the solution with a number of iterations. With an initial guess, $x_0$, iterative methods approach the solution x in the following process:

$$x_{n+1} = Bx_n, \quad \text{(Eq. 11)}$$

where $n \geq 0$ and B is a preconditioned matrix for the iterative solution. For an iterative solution to be efficient, this process should be able to approach the solution with acceptable accuracy in a relatively small number of iterations and the computation of $Bx_n$ should be fast. The Krylov-subspace iterative method has good convergence properties and is able to approach circuit solution reasonably fast. The purpose of preconditioning is to make matrix B close to the identity matrix to speed up the iterative process.

In circuit simulation, the size of the linear system can be very big and the pattern of the entries in the matrix can be sparse. Hence, standard circuit simulators all adopt some sparse matrix representation of matrix A. In a sparse representation of a matrix, it is common to only store the entries of the matrix that are non-zero. The non-zero pattern of a sparse matrix is important for the efficiency of LU decomposition. This is because the operation can create non-zero entries in L and U while entries of J in the same places are zero. These entries are called "fill-ins." To reduce the number of fill-ins, one can reorder the linear system. The reordering process is a permutation of vectors x and b in the linear system. It leads to a permuted linear system:

$$J_r x' = r', \quad \text{(Eq. 12)}$$

where $J_r$ is a row and column permutation/reordering of J, r' is the row permutation of r, and x' is the column permutation of x. For convenience of further illustration, the subscript and superscripts may be dropped in this description. The purpose of the reordering is to minimize the number of fill-ins created during the LU decomposition of the matrix, which will lead to faster simulation.

In typical parallel circuit simulation, this type of reordering is performed for an additional purpose. One wants to reorder the circuit matrix into the so-called double-bordered system shown in FIG. 3.

In performing the LU decomposition of the reordered matrix $J_r$, some block operations can be performed in parallel, i.e. the LU decomposition of matrix blocks $A_1, A_2, \ldots, A_{m-1}$. The bottleneck of the parallel computation is to perform the LU decomposition of the last block. Note that the last block could become dense during the LU decomposition process because of the contributions from the coupling blocks, i.e. the C blocks and the D blocks.

The domain-based multi-level recursive block incomplete LU (ILU) method (BILUTM) proposed by Y. Saad et al. is different from our method. BILUTM was proposed as a general matrix solution. One approach of that method is to apply Krylov-subspace method at all levels of BILUTM, which was reported in the publications for the BILUTM method. At the l-th level of the procedure, the block factorization of the matrix is computed approximately (superscript corresponding to level numbers):

$$A^l = \begin{pmatrix} B^l & F^l \\ E^l & C^l \end{pmatrix} \approx \begin{pmatrix} L^l & 0 \\ E^l(U^l)^{-1} & I \end{pmatrix} \times \begin{pmatrix} U^l & (L^l)^{-1}F^l \\ 0 & A^{l+1} \end{pmatrix} \quad \text{(Eq. 12.1)}$$

where $B^l \approx L^l U^l$ and $A^{l+1} \approx C^l - (E^l(U^l)^{-1})((L^l)^{-1}F^l)$.

For circuit simulation, the above approach leads to the application of the Krylov-subspace iterative method at the top circuit matrix level, which can be very inefficient due to the nature of circuit simulation matrices, which have special characteristics. More specifically, circuit simulations matrices may be very large yet sparsely populated. Applying Krylov-subspace method at the top level means that the Krylov-subspace vectors are of the same size of the top-level matrix. These vectors will consume a lot of computer memory and are slow to calculate. Another possible modified use of the BILUM method is to apply Krylov-subspace method at a particular level of BILUTM, i.e. a particular reduced block. However, the reduced block could become very dense without applying approximation technique while one reduces the top-level matrix to the reduced block.

In the approach by Saad et al., incomplete LU decomposition (ILU) is stored while the approximation error is discarded, which is fine for using ILU decomposition as the preconditioning matrix. Hence, in every iteration, one needs to calculate the product of the original matrix and a vector and the product of the preconditioning matrix and a vector.

For the reasons described above, a new hybrid direct and iterative approach is needed to solve the bottleneck problem caused by the LU decomposition when using parallel computation, when circuit simulator 55 (FIG. 1) may be a computer system having a plurality of processor cores or processor units that respond to logic causing the computer system to perform the function of the circuit simulation. The logic may be implemented as software, hardware, or a combination of software and hardware.

SUMMARY

Broadly speaking, the present invention fills these needs by providing a parallel multi-rate circuit simulator combining the advantages of both direct and iterative methods, enabling increased parallelism during a simulation.

It should be appreciated that the present invention can be implemented in numerous ways, including as a process, an apparatus, a system, a device, or a method. Several inventive embodiments of the present invention are described below.

In one embodiment, a computer-implemented method for solving parallel equations in a circuit simulation is described. The method includes partitioning a circuit Jacobian matrix into loosely coupled partitions, reordering the voltage vector and the matrix according to the partitions, and splitting the Jacobian matrix into two matrices M and N, where M is a matrix suitable for parallel processing and N is a coupling matrix. M and N are then preconditioned to form $M^{-1}Jx=(I+M^{-1}N)x=M^{-1}r$ and the Jacobian matrix J is solved using an iterative solving method.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 7 shows the matrix example of FIG. 5, reordered according to the graph portions represented in FIG. 6.

FIGS. 8A and 8B show examples of ways to split the matrix shown in FIG. 7.

FIG. 9 shows one example of a matrix structure.

FIGS. 10A and 10B show matrices M and N resulting from a splitting operation performed on the matrix structure represented in FIG. 9.

FIG. 11 shows a matrix $I+M^{-1}N$ generated from the matrices shown in FIGS. 10A and 10B.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Prior to production of a prototype circuit, a system of differential or algebraic equations (DAE) may be created using known techniques to model the circuit. The DAE are discretized to make them suitable for numerical evaluation. Various methods are known for discretization, any one or more of which can be used for discretizing the system of DAE. If the DAE are non-linear, such as when the circuit uses non-linear components such as transistors, they may then be linearized to form a linear system which can then be solved using a parallel matrix method herein described. The solution to the linear system may give voltages, currents, and/or charges or changes to voltages, currents, and/or charges at each node of the circuit. The final solution can then be analyzed to ensure that the modeled circuit behaves in the expected manner prior to producing a prototype for physical testing.

Partitioning and Splitting

Figure 1:
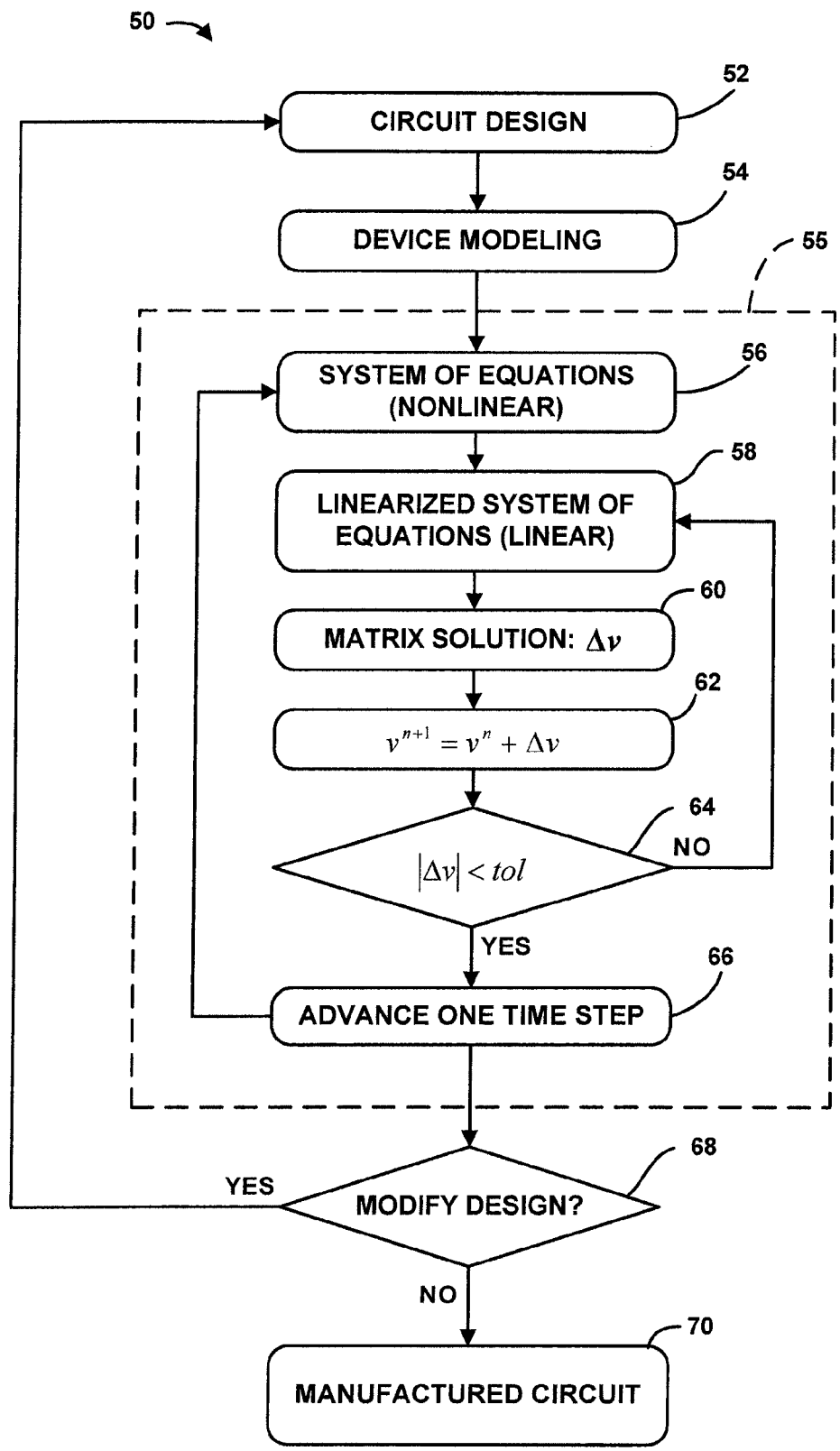
FIG. 1 shows a flow diagram illustrating typical transformations and operations performed in producing an integrated circuit from a circuit design.
Figures 2, 3:
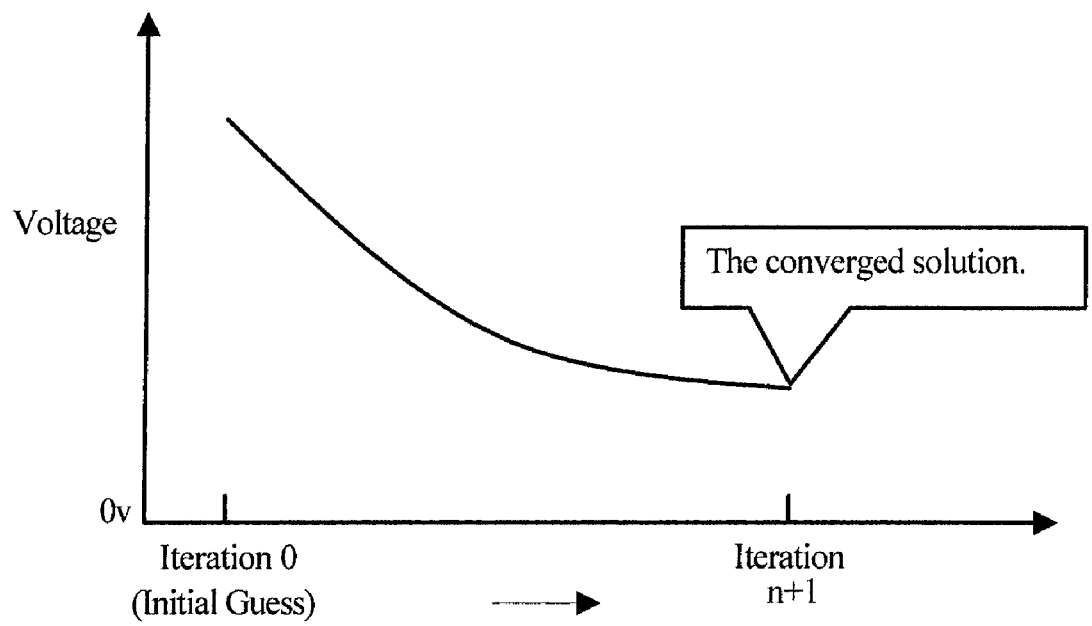
FIG. 2 shows a graph illustrating how a sequence of solutions can converge.
FIG. 3 shows an example of a double-bordered system.
Figure 4:
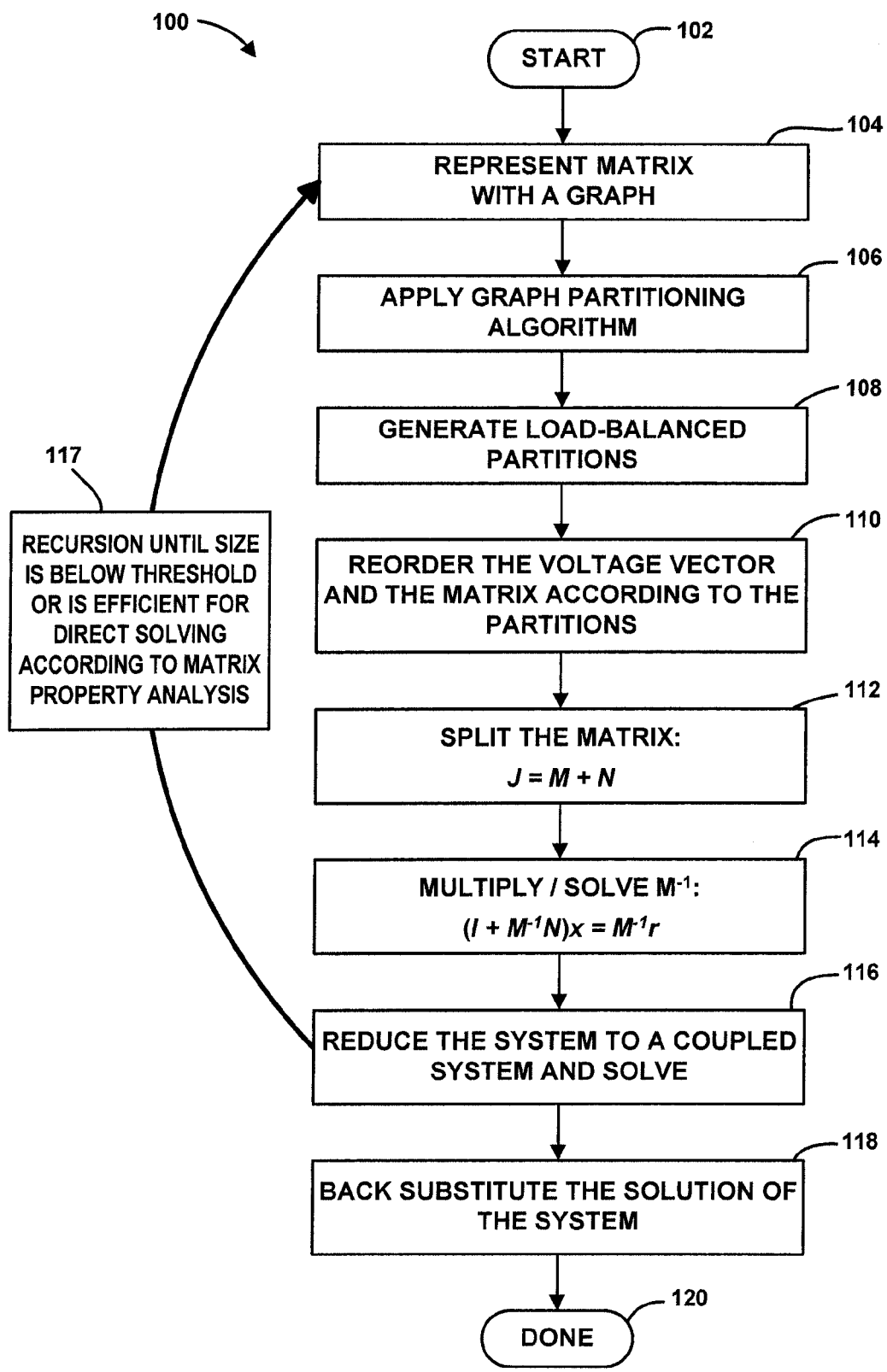
FIG. 4 shows a flowchart presenting method for rapidly solving equations in parallel for a circuit simulation.

FIG. 4 shows a flowchart 100 presenting method according to one embodiment for rapidly solving parallel equations for a circuit simulation. The present approach herein described is applicable to circuit equations in different formulations that include nodal analysis, modified nodal analysis, equations with distributed elements, etc. The procedure begins as indicated by start block 102 and proceeds to operation 104 wherein the matrix is represented with a graph. Initially, the circuit Jacobian matrix is partitioned to loosely coupled blocks. Matrix J is transformed to a graph so that general parallel multi-level graph partitioning algorithms can be applied. In the transformation, first a symmetric matrix is obtained:

$$J_S = [\max(\text{abs}(J_{ij}), \text{abs}(J'_{ij}))] \qquad \text{(Eq. 13)}$$

where J' is the transpose of J and $1 \leq i, j \leq J_{Size}$. $J_{Size}$ denotes the size of J.

$J_S$ is transformed to a graph in the following way. An edge is created for each entry in the lower or upper triangular part. An entry in row i and column j will be represented as an edge that connects the $i^{th}$ vertex and the $j^{th}$ vertex in the graph. Each vertex represents a column and a row with the same index. Then, parallel graph partitioning algorithms may be applied to partition the graph into load-balanced components and minimize the number of edges needed to cut in order to separate the components. Suitable parallel graph partitioning algorithms are known and readily available. After the partitioning, all the coupling entries are split, the edges in the graph are cut into a second matrix rather than reordered to the last block.

Figures 5, 6:
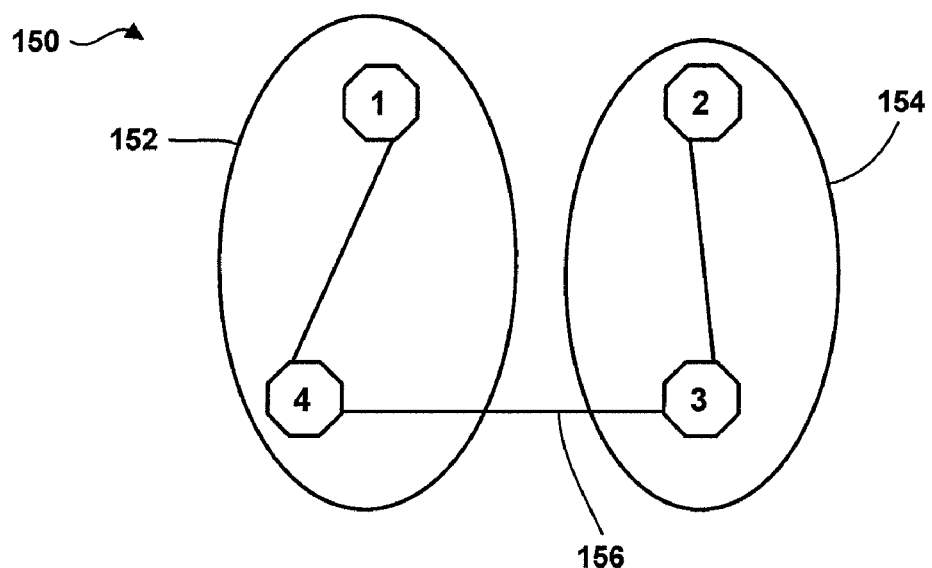
FIG. 5 shows a matrix example and a symmetric matrix formed from the matrix example.
FIG. 6 shows a graph formed from the symmetric matrix in FIG. 5.

This process is illustrated by way of example in FIGS. 5 and 6. In FIG. 5, $J_{example}$ is a matrix example and $J_{Sexample}$ is $J_{example}$ transformed into a symmetric matrix. $J_{Sexample}$ can then be transformed into the graph 150 shown in FIG. 6. Returning to FIG. 4, the procedure continues with operations 106 and 107 wherein a graph partitioning algorithm is applied to the graph generated in operation 104 to generate load balanced partitions as represented in operation 108. Continuing the example of FIG. 5, a resulting graph 150 is shown in FIG. 6. Graph 150 is divided into two partitions 152 and 154, for which only one edge 156 needs to be cut.

Next, in operation 110, matrix $J_{example}$ is reordered as shown in FIG. 7 according to the corresponding graph partitions. In this example, the second partition (2,3) is reordered after the nodes in the first partition (1,4). After partitioning, the matrix is split into two matrices in operation 112. For purposes of explanation, the splitting may be denoted as $$J = M + N, \qquad \text{(Eq. 14)}$$

where M is the matrix good for parallel computation and N is the coupling matrix. For the example matrix, there are two ways to split it, shown in FIGS. 8A and 8B.

In operation 114, the linear system may then be preconditioned and an iterative method may be applied to solve matrix J, i.e., $$M^{-1}Jx = (I+M^{-1}N)x = M^{-1}r \quad \text{(Eq. 15)}$$

where $x \equiv \Delta v$ and I is the identity matrix that has 1 on the diagonal and 0 on the off diagonal.

The purpose of the preconditioning is to make the preconditioned matrix $I+M^{-1}N$ as close to identity matrix as possible. This way it will take fewer iteration steps for the iterative method to converge to an approximate solution. The traditional FastMOS circuit simulators apply a lot of partitioning heuristics that generate weak couplings, i.e. the capacitive couplings at the gates of MOSFET devices. Those heuristics may still be useful here. However, iterative methods may be applied that are more advanced than traditional relaxation type of methods used in FastMOS circuit simulators. The advanced iterative methods described herein can also handle strong couplings. The convergence property of these iterative methods is still good with strong couplings that appear in matrix N.

To improve the performance of parallel computation, the partitioned and reordered matrix may be split by first discovering the entries in the upper off-diagonal blocks. For example assume the matrix has the structure represented in FIG. 9 after block partitioning. The upper off-diagonal blocks discovered are $C_{11}$, $C_{21}$, $C_{12}$ and $C_{22}$. They belong in two columns of the matrix, column 8 and column 11. All the entries in columns 8 and 11 can then be moved into the coupling matrix N except the diagonal entries, as shown in FIGS. 10A and 10B. After splitting the matrix, the matrix operation $M^{-1}N$ may be applied in a direct matrix solving approach. It should be noted that there are only two columns in $M^{-1}N$. Matrix $I+M^{-1}N$ has the form presented in FIG. 11.

Returning to FIG. 4, after splitting the matrix in operation 112 and preconditioning in operation 114, the independent subsystem may be solved as provided by operation 116 as follow:

$$\begin{bmatrix} S_{11} & S_{12} \\ S_{21} & S_{22} \end{bmatrix} \begin{bmatrix} x_8 \\ x_{11} \end{bmatrix} = \begin{bmatrix} M^{-1}r|_8 \\ M^{-1}r|_{11} \end{bmatrix}. \quad \text{(Eq. 16)}$$

In operation 116, the system is reduced to a coupled system and solved. Depending on the size of the system or whether, through matrix property analysis, the system can be efficiently solved by direct solving, operations 104 through 116 may be repeated to recursively further reduce the subsystem, as indicated by operation 117. This recursion is further described below with reference to FIGS. 12 and 15. In operation 118, the solution of the reduced coupled system is back-substituted into Equation 15, and the procedure ends as indicated by done block 120. Thus, back substitution may be used to obtain all the remaining solutions. The set of the coupling indices may be denoted as:

$$I_C = \{8, 11\}. \quad \text{(Eq. 17)}$$

This approach is effective when the size of the coupled sub-system is relatively small. It becomes ineffective when the size of the coupled sub-system is big. Note that the matrix of the coupled sub-system $$S = \begin{bmatrix} S_{11} & S_{12} \\ S_{21} & S_{22} \end{bmatrix} \quad \text{(Eq. 18)}$$

is dense. If the size of matrix S is big, it may be inefficient to invert it.

In parallel computation, this matrix S of Equation 18 can be a bottleneck that limits parallel matrix solvers' scalability to more CPU cores or system with a lot of couplings. Ideally, the number of partitions is proportional to the number of CPU cores, with more partitions leading to more entries in the N matrix.

Hybrid Direct and Iterative Method

Figure 12:
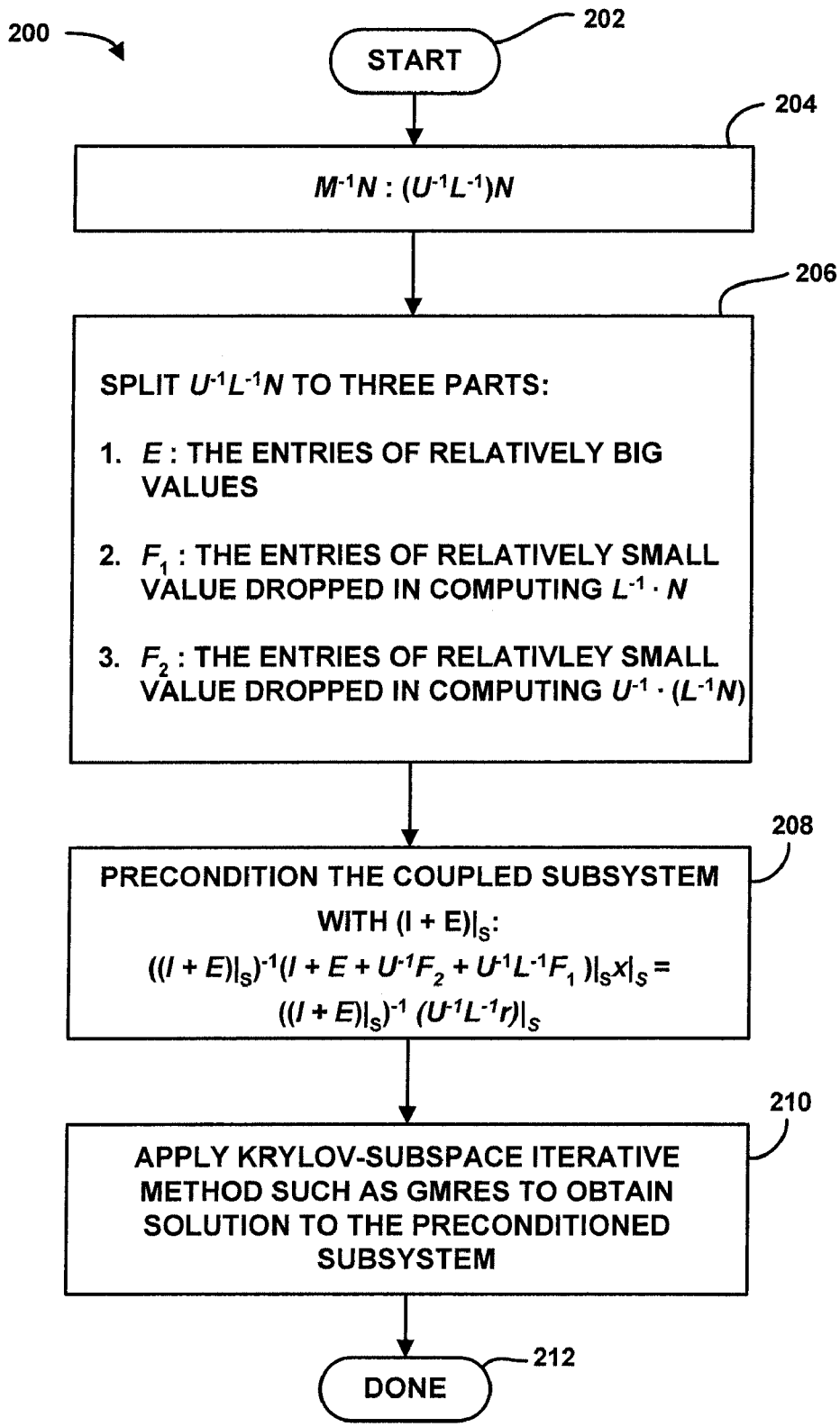
FIG. 12 shows a flowchart depicting a procedure example for a hybrid or combined direct and iterative method to solve matrix $I+M^{-1}N$.

FIG. 12 shows a flowchart 200 depicting a procedure example for a hybrid or combined direct and iterative method to solve matrix $I+M^{-1}N$. The procedure begins as indicated by start block 202 and flows to operation 204 where $M^{-1}$ is replaced with $U^{-1}L^{-1}$. Then, in operation 206, $U^{-1}L^{-1}N$ is split into three parts:

$$U^{-1}L^{-1}N = E + (LU)^{-1}F_1 + U^{-1}F_2 \quad \text{(Eq. 19)}$$

The first part, E, captures the matrix entries that are relatively big in value after the calculation of $U^{-1}L^{-1}N$. The second part, $(LU)^{-1}F_1$ and the third part $U^{-1}F_2$ capture entries that are relatively small in value during the calculation.

$F_1$ is formed during the calculation of $$L^{-1}N = E_0 + L^{-1}F_1. \quad \text{(Eq. 20)}$$

$F_2$ is formed during the calculation of $$U^{-1}L^{-1}N = U^{-1}(E_0 + L^{-1}F_1) = E + U^{-1}F_2 + U^{-1}L^{-1}F_1. \quad \text{(Eq. 21)}$$

In splitting out the $F_1$ and $F_2$ during the forward elimination, $L^{-1}$, and backward substitution, $U^{-1}$, the relative magnitude of fill-in entries is checked. If the entry is in the original vector, then it is not split out to $F_1$ or $F_2$. Instead, different magnitude tolerances may be used to control the entries in the rows of the coupled subsystem and the other rows.

It should be noted that the above approach is different from the approach by Saad et al. (BILUTM). In this approach, the residue of incomplete LU decomposition is kept while in Saad's approach, residue of incomplete LU decomposition is discarded, which is also explained above under the heading "Background."

With $U^{-1}L^{-1}N$ split into the three parts described above, $M^{-1}$ gives:

$$(I+E+U^{-1}F_2+U^{-1}L^{-1}F_1)x = U^{-1}L^{-1}r. \quad \text{(Eq. 22)}$$

It should be noted that there is an independent coupled sub-system in this system. The row and column indices of the entries in the sub-system belong to the coupling index set $I_C$. The projection of the matrix $I+E$ to the subsystem may be denoted as $$(I+E)|_S. \quad \text{(Eq. 23)}$$

In operation 208, this matrix is then be used as the preconditioner to the subsystem of Equation 22:

$$((I+E)|_S)^{-1}(I+E+U^{-1}F_2+U^{-1}L^{-1}F_1)|_S x|_S = ((I+E)|_S)^{-1}(U^{-1}L^{-1}r)|_S \quad \text{(Eq. 24)}$$

Finally, in operation 210, a Krylov-subspace iterative method may be applied. For example, the Generalized Minimal RESidue (GMRES) method can be used to solve the preconditioned system.

It should be noted that the length of the Krylov-subspace vector described herein is only of the size of the reduced subsystem while the length of the Krylov-subspace vector in Saad's method is of the size of the original matrix, which is also explained above under the heading, "Background."

It should also be noted that it is convenient for us to use a direct solver to solve the reduced subsystem, which is meaningful when the reduced system is very sparse. By doing this, the method degrades to pure direct method. For very sparse matrix, direct solver could be faster than iterative solver. In one embodiment, this flexibility is advantageously built-into the hybrid direct and iterative method presently described.

After the solution to the subsystem is obtained, we can obtain the solution to the full system through back substitution of the solution to the subsystem, and the procedure is complete as indicated by done block 212.

It should be noted that one may apply the above hybrid direct and iterative method recursively to solve the reduced subsystem, $(I+E)|_S$. In each recursive step, the size of the reduced subsystem becomes even smaller. In one embodiment, the recursion is stopped when the size of the reduced subsystem drops below a pre-determined threshold or when the subsystem is determined to be efficient for direct solving through matrix property analysis. At that point, a direct method is applied to solve the final small subsystem, whereupon the procedure is finished as indicated by done block 212. For example, in one embodiment, a direct method is applied when the subsystem matrix drops to 100 rows or fewer. In another embodiment, a direct method is applied when the LU decomposition of the subsystem matrix generates a small number of fill-in's.

Reordering Matrix with Minimum Vertex Separators

Figures 13, 14:
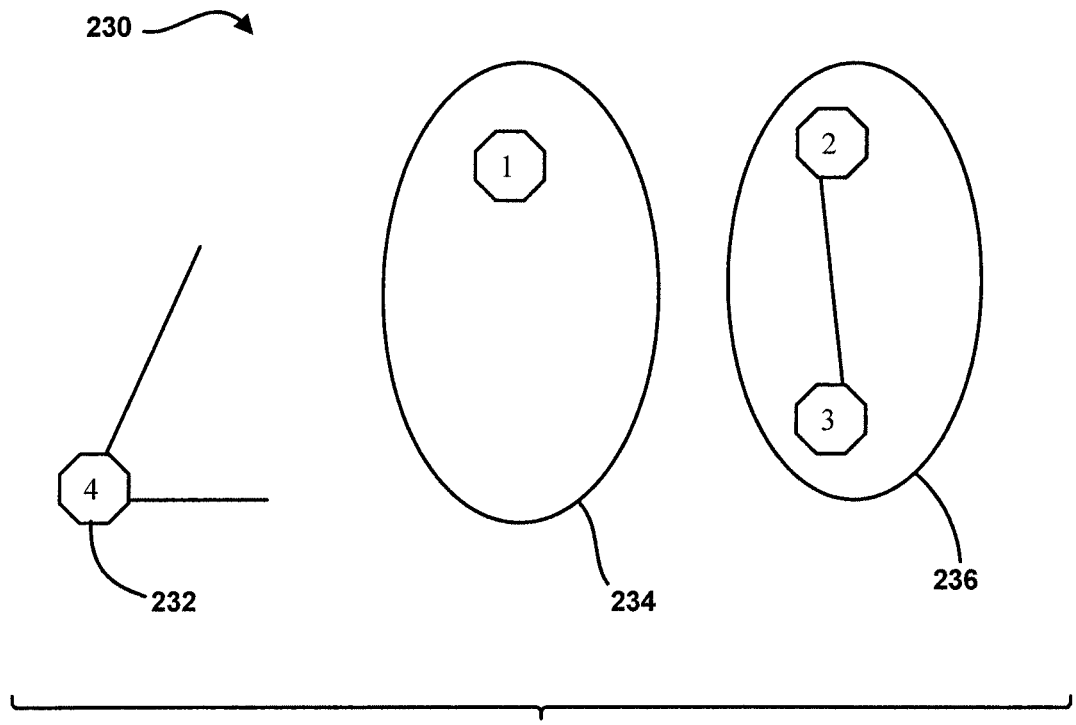
FIG. 13 shows the graph example of FIG. 6 with a set of vertices (vertex 4) removed from the graph.
FIG. 14 shows an the matrix example of FIG. 5 split into two matrices according to the vertex separator identified in FIG. 13.

In another exemplary embodiment, the circuit matrix may be reordered according to a set of vertex separators and a more efficient solving technique may be applied. A set of vertex separators is the set of vertices one can remove from a graph, together with edges incident to S, so as to break the graph into two disconnected components or subgraphs. This graph partition algorithm tries to find the minimum set of vertex separators. For example, the minimum set of vertex separators in example graph 150 in FIG. 6 is one vertex: vertex 4 as shown in FIG. 13. Vertex 3 can also be chosen for the vertex separator.

The vertices may be reordered with the minimum set of vertex separators at the end. In example graph 150 shown in FIG. 6, there is no need to do the reordering since vertex 4 is already the last vertex. If vertex 3 were to be chosen as the vertex separator, then the vertices may be reordered such that vertex 3 becomes the last one. Since the vertex separator (vertex 4) is ordered at the end, the matrix $J_{example}$ can keep the original form as shown in FIG. 5.

Matrix $J_{example}$ can then be split by splitting out the columns corresponding to the vertex separators, which are ordered at the end. To split these columns, only the non-diagonal entries in the columns need to be split out. The split-out matrix may be denoted as N and the remaining main matrix as M. For our example matrix, $J_{example}$=M+N, as shown in FIG. 14.

Assume that M has the following LU decomposition: M=LU. The lower matrix L can be used to precondition the linear system in circuit simulation as follows:

$$L^{-1}Jx=L^{-1}(M+N)x=(U+L^{-1}N)x=L^{-1}r. \quad \text{(Eq. 25)}$$

Figure 15:
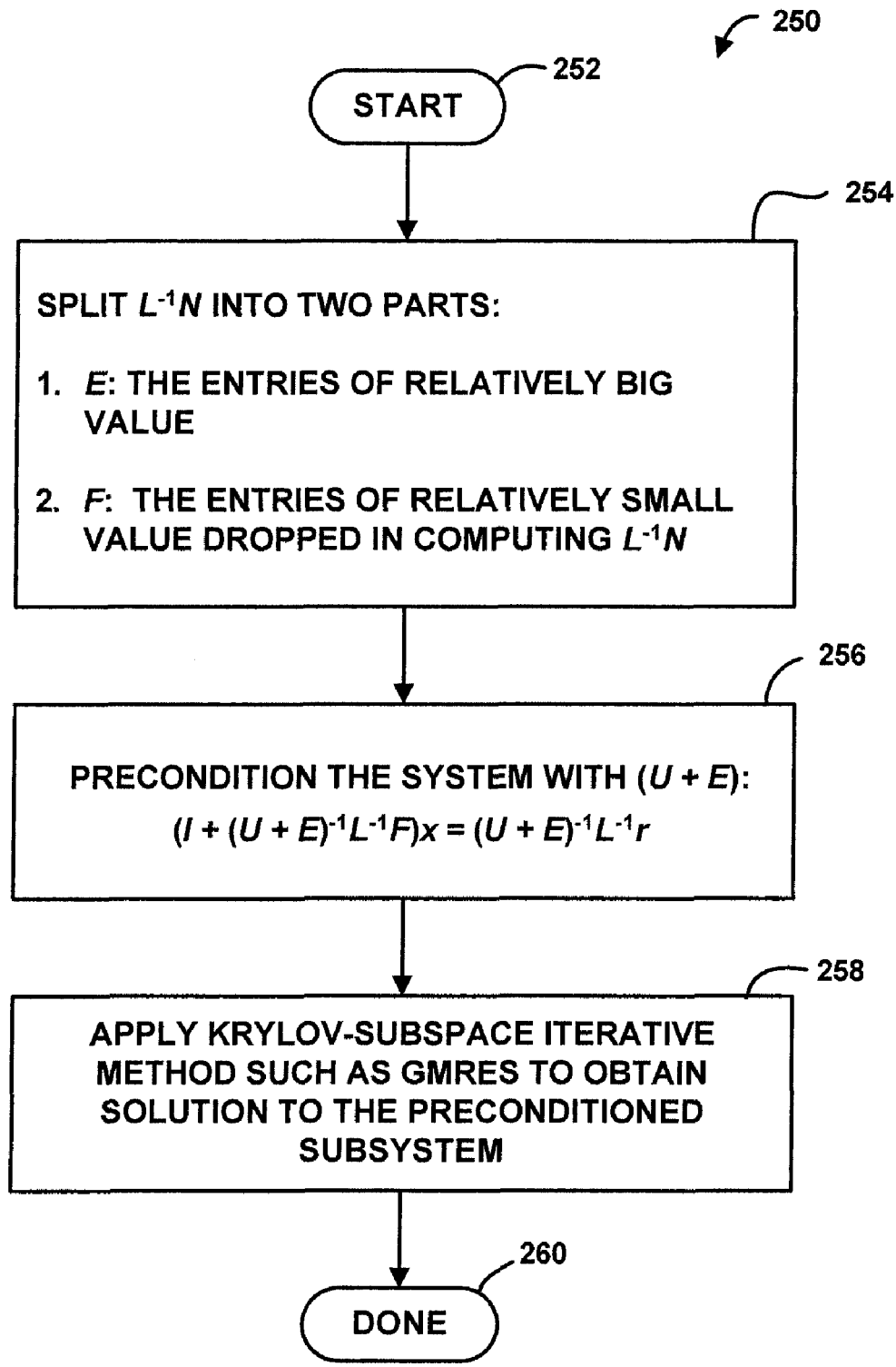
FIG. 15 shows a flowchart for solving linearized and preconditioned circuit equations $(I+L^{-1}N)x=L^{-1}r$.

FIG. 15 shows a flowchart 250 for solving linearized and preconditioned circuit equations $(U+L^{-1}N)x=L^{-1}r$. The procedure begins as indicated by start block 252 and proceeds to operation 254 wherein $L^{-1}N$ is split into two parts:

$$L^{-1}N=E+L^{-1}F. \quad \text{(Eq. 26)}$$

The first part E consists of the entries that are relatively big after the calculation of $L^{-1}N$. The second part, $L^{-1}F$, consists of entries that are relatively small. This splitting is formed during the calculation of $L^{-1}N$ by comparing the values of the entries. The linear system to be solved in the circuit simulation becomes:

$$(U+E+L^{-1}F)x=L^{-1}r. \quad \text{(Eq. 27)}$$

Next, in operation 256, the linear system is preconditioned with (U+E) to form the following preconditioned system:

$$(U+E)^{-1}(U+E+L^{-1}F)x=(I+(U+E)^{-1}L^{-1}F)x=(U+E)^{-1}L^{-1}r. \quad \text{(Eq. 28)}$$

It should be noted that matrices E and F have non-zero values only in the last columns corresponding to the vertex separators. Hence, matrix U+E is in upper triangular form except the last block corresponding to the vertex separators. In this linear system, the sub-system corresponding to the vertex separators is independent.

Figure 16:
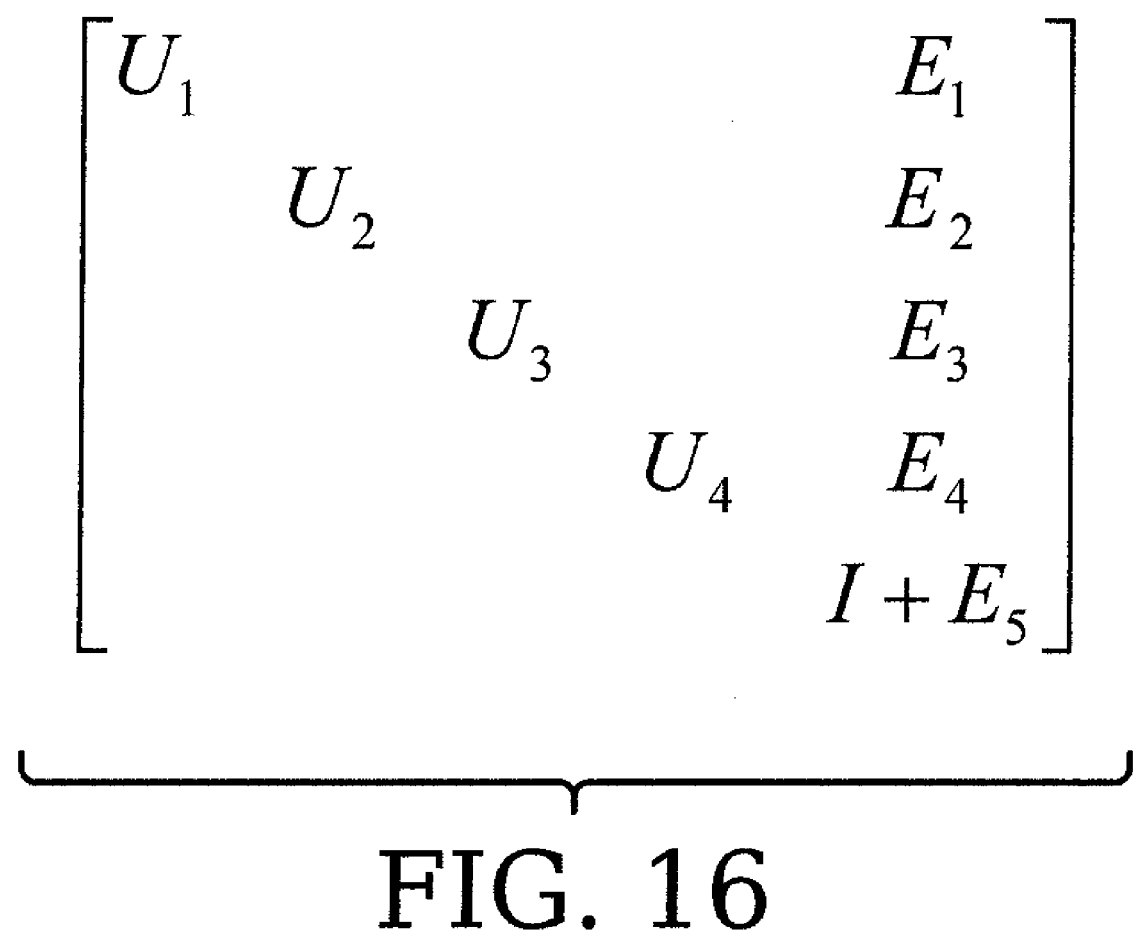
FIG. 16 shows a matrix structure for U+E.

Finally, in operation 258, Krylov-subspace iterative methods such as GMRES may be applied to solve the sub-system. In each iteration, the matrix-vector product $$x|_{subsystem}+((U+E)^{-1}L^{-1}F\cdot x)|_{subsystem} \quad \text{(Eq. 29)}$$

is calculated, where $|_{subsystem}$ denotes the projection of a vector to the sub-system. In computing $F\cdot x$, only $x|_{subsystem}$ makes a contribution because the only non-zero columns in F are those corresponding to the sub-system. This also explains why the sub-system is independent. In inverting matrix L, the diagonal blocks corresponding to the separated partitions can be inverted in parallel. In computing matrix-vector product, $(U+E)^{-1}\cdot(L^{-1}Fx)$, the following system:

$$(U+E)y=L^{-1}Fx, \quad \text{(Eq. 30)}$$

may be solved, where $L^{-1}Fx$ is a vector already computed. Note that the diagonal of U contains 1's and the last block in U, corresponding to the vertex separators, has only diagonal 1's. For example, assume the matrix has 4 partitions. In this case, U+E has the structure represented in FIG. 16. To solve this system, the last block, $I+E_5$, corresponding to the vertex separators may be solved first. It should be noted that this sub-system is independent.

It should be noted that the length of our Krylov-subspace vector is only of the size of the reduced subsystem while the length of the Krylov-subspace vector in Saad's method is of the size of the original matrix, as explained above under the heading, "Background."

It should also be noted that it is convenient to use a direct solver to solve the reduced subsystem, which is meaningful when the reduced system is very sparse. By doing this, the method degrades to a pure direct method. For very sparse matrix, the direct solver could be faster than the iterative solver. It is advantageous for the method described herein to have this flexibility, which is a unique feature of the present hybrid direct and iterative method.

After the solution to the sub-system, $x_{subsystem}$, is obtained, back-substitution can be used to reduce the system. In solving the remaining system, the blocks corresponding to individual partitions may be solved in parallel. The solution to the system can be obtained in the following way:

$$x=(U+E)^{-1}L^{-1}r-(U+E)^{-1}L^{-1}Fx|_{subsystem}. \quad \text{(Eq. 31)}$$

The matrix solver technique described above with reference to FIG. 15, which includes the hybrid direct and iterative method, may be applied recursively in the inversion or solving of the sub-matrix $I+E_5$. If sub-matrix $I+E_5$ is still of big size, the method can be applied recursively to keep the sparsity of the sub-matrix and exploit more parallelism in its computation. In each recursive step, the size of the reduced subsystem becomes even smaller. The recursion may be stopped when the size of the reduced subsystem drops below a pre-determined threshold or when the subsystem is determined to be efficient for direct solving through matrix property analysis. At that point, a direct method may be applied to solve the final small subsystem, whereupon the procedure ends as indicated by done block 260. For example, in one embodiment, a direct method is applied when the subsystem matrix drops to 100 rows or fewer. In another embodiment, a direct method is applied when the LU decomposition of the subsystem matrix generates a small number of fill-in's.

Because simulation matrices can be huge and yet sparsely populated, Krylov-subspace method is applied at the subsystem level. In the methods herein described, the splitting technique is applied to matrix block N, in which the columns correspond to the couplings, and the matrix block N is at the original linear system level. In addition, the above described methods are column-based in computing E (part of $L^{-1}N$). As a result, this implementation is easy to parallelize on shared-memory parallel computers.

One advantage of this method is that Krylov-subspace method is not applied to the top-level circuit matrix, J, whose size can be huge. Instead, the Krylov-subspace method is applied to the coupling sub-system whose size is much smaller. Yet, the splitting is applied in computing $L^{-1}N$ to keep the sparsity of the original circuit matrix as much as possible. This solves the problem of storing and orthogonalizing Krylov-subspace vectors with the size of the top-level circuit linear system. The presently described approach can therefore leverage the best of both direct method and iterative method for solving huge circuit matrices.

The present numerical method, together with a flexible data structure, which is described below, ensures that the matrix solver provides efficient transient simulation in circuit simulation. In transient simulation, one needs to solve the matrix, which has different non-zero values, many times. The present approach has the flexibility in handling the matrix splitting dynamically. As described below, the present approach is also suitable for static, periodic, and quasi-periodic simulations.

Dynamic Data Structure for Splitting

The matrices E, $F_1$, and $F_2$ may be very dynamic. Specifically, it may change at every step during simulation. To facilitate efficient and flexible data storage, hash-tables may be used. For each entry in a column vector of the matrices, the row index in the original column vector, the index in the compact vector (no zeros), and the value, may be stored. In one embodiment, for example, a Map or a Vector in C++ STL library is used to store each column of the matrices.

A hash-table may also be used to store indices that belong to the sub-system in the full system. A Vector may be used to store the coupling index set $I_C$. One advantage of using a hash-table is that a limited number of indices needs to be stored no matter how huge the size of the full system is. Furthermore, whether an index belongs to the set can be determined in linear time.

In another embodiment, a binary tree is used for the dynamic data structure. By using a binary search tree, the indices can always be kept in order and the tree can easily be traversed in a certain order. By using this data structure, insertions into the tree can be made in log(n) time where n is the size of the tree. When n is not that big, this CPU time is acceptable. Likewise the location of an entry or index in the tree can be found in log(n) time.

These dynamic data structures facilitate the building of matrices E, $F_1$, and $F_2$. We can keep the building of these matrices efficient.

Parallel Multi-Rate Simulation

Integrated circuits have multi-rate behavior in their functioning. The multi-rate behavior is due to the fact that integrated circuits handle both high frequencies and low frequencies during their operations.

In circuit simulation, the high-frequency signals need more time steps to resolve while the low-frequency signals need less time steps to resolve. Moreover, for digital-like signals, the edge needs more time step to resolve while the flat region needs few time steps to resolve. In traditional Spice-type circuit simulation, the property cannot be employed because the whole circuit is not partitioned and a global time step is applied in discretizing the circuit equations. To guarantee accuracy, the smallest time step has to be applied in simulation. The more time steps simulation takes, the slower it becomes.

To speed up traditional Spice-type circuit simulation, Fast-Mos circuit simulators partition the whole circuit into different partitions and assign different time steps to different partitions to employ the multi-rate behavior. If signals in one partition are of high frequency, we take small time steps in simulation. If signals in another partition are of low frequency, we take large time steps in simulation. In implementing this multi-rate simulation method, FastMOS simulators adopt the event-driven scheme. The event-driven scheme determines partitions or subcircuits to solve according to event propagation. If an event happens in a partition, that partition gets simulated for one iteration or one time step.

The event-driven scheme only simulates the partitions that have to be simulated. Hence it can save unnecessary computation and achieve a lot of speedup over traditional Spice simulators. However, a severe drawback is that the event flow is serial, namely the happening of one event is dependent on previous events. The known attempts in this area are waveform relaxation and optimistic scheduling. There techniques are too aggressive for general circuit simulation and unsuccessful.

Parallelizing the simulation of one event is not a solution either because the amount of computation involved is insignificant. The amount of work for simulating one event is basically the amount of work involved in simulating one partition for one time step. In general, these partitions are very small in FastMOS simulations. For example, there might only be two transistors in one partition. One cannot achieve acceptable parallel efficiency by parallelizing this small amount of simulation work.

In a parallel multi-rate simulation scheme described herein for illustration purposes, the event-driven scheme is not used. Instead, all the active partitions are solved together. This group of active partitions can grow dynamically during each nonlinear iteration at each time step.

Periodically, a correction step may be performed. In the correction step, multiple time steps are solved together to for increased accuracy. The parallel matrix solver described above may be employed to decouple the coupled system that involves many partitions and many time steps. If one solves the system in a brute-force direct or iterative manner, the computation may be too slow or inefficient. Iterative methods similar to the one used in shooting-Newton RF simulation algorithm may also be too inefficient. In such a brute-force iterative method, one would use Krylov-subspace method to solve the linear system with diagonal and sub-diagonal blocks as the preconditioner. In this case, the couplings are not considered in the preconditioning solving. Thus, these brute-force methods are unsuitably slow to simulate big circuits.

Application in Various Types of Circuit Simulation

In addition to transient circuit simulation, the parallel matrix solver can be applied in static circuit simulation, also referred to as "DC" circuit simulation or periodic or quasi-periodic steady-state RF simulation. In one embodiment of DC simulation, which is called pseudo-transient DC simulation, the voltage and current sources are ramped up from 0 value to DC value. Then, the simulation is continued along time to reach steady state, which is the DC solution. In another embodiment of DC simulation, we can apply our method to solve the static circuit equations:

$$i(v)+u_0=0 \qquad \text{(Eq. 31.5)}$$

which is Eq. 1 without the dynamic part.

The parallel matrix solver can also be applied in radio frequency (RF) circuit simulation. RF circuit simulation method, such as the finite-difference or the shooting-Newton method, solves for periodic or quasi-periodic solution in some time intervals. For that purpose, Eq. 1 without some periodic or quasi-periodic boundary condition is solved. Take periodic steady state for example, the boundary condition is $v(t1)=v(t2)$ where $[t1,t2]$ is the periodic time interval. The finite-difference or shooting-Newton method solves for a solution satisfying the boundary condition where the matrix solver described herein may be used to solve the linearized linear system.

Computer Implementation

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as producing, identifying, determining, or comparing.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer-implemented method for simulating operation of an integrated circuit, the method comprising:

using a parallel processing system, generating a system of differential or algebraic equations (DAE) modeling operation of the integrated circuit;

discretizing the system of DAE to form a discretized DAE;

partitioning the integrated circuit into load balanced partitions, each partition representing a subsystem of the integrated circuit;

for each partition representing a subsystem of the integrated circuit:

when the DAE are nonlinear, linearizing the discretized DAE using a nonlinear iterative method to obtain a linear system having a circuit Jacobian matrix;

solving the linear system using a linearized circuit Jacobian matrix solver, wherein the solving comprises:

splitting the circuit Jacobian matrix into two matrices M and N, wherein M is a matrix suitable for parallel processing and N is a coupling matrix;

preconditioning the two matrices M and N to form a preconditioned equation having a matrix of foLm $I+M^{-1}N$, where I is an identity matrix having ones on a diagonal and zeros on off-diagonal positions of the identity matrix; and obtaining a solution to $I+M^{-1}N$ in the preconditioned equation using a combined direct and iterative solving method; and recursively performing the steps from partitioning the circuit till obtaining a solution to $I+M^{-1}N$ to reduce sizes of subsystems of the integrated circuit.

2. The method of claim 1, wherein the generating the system of DAE comprises mapping a design of the integrated circuit to the system of DAE, the system of DAE defining a change in voltage at each of a plurality of nodes in the integrated circuit, the change in voltage occurring over a definable period of time.

3. The method of claim 2, wherein solving the system of DAE for a full system comprises:

substituting the solution into the discretized DAE to obtain the change in voltage for each of the plurality of nodes;

adding the change in voltage for each of the plurality of nodes to a current voltage vector to obtain a new voltage vector to provide a new voltage value at each of the plurality of nodes;

advancing one time step to solve a new system of DAE at a next time step; and repeating the solving for successive time steps, thereby modeling a transient behavior of the integrated circuit.

4. The method of claim 1, wherein obtaining the solution to $I+M^{-1}N$ comprises:

replacing $M^{-1}$ with $U^{-1}L^{-1}$ to form a term $U^{-1}L^{-1}N$, where U is an upper triangular matrix and L is a lower triangular matrix; and splitting $U^{-1}L^{-1}N$ into three parts: a first part, a second part, and a third part, wherein the first part captures matrix entries that are relatively big in value, and the second and third parts capture entries that are relatively small in value during calculation.

5. The method of claim 4, wherein the first part is a matrix E, the second part is a matrix $(LU)^{-1}F_1$, and the third part is a matrix $F_2$, such that $U^{-1}L^{-1}N=E+(LU)^{-1}F_1+F_2$.

6. The method of claim 5, wherein $F_1$ is formed during a calculation of $L^{-1}N=E_0+L^{-1}F_1$; and $F_2$ is formed during a calculation of:

$$U^{-1}L^{-1}N=U^{-1}(E_0+L^{-1}F_1)=E+U^{-1}F_2U^{-1}L^{-1}F_1.$$

7. The method of claim 4, wherein $M^{-1}$ is given by a subsystem $(I+E+U^{-1}F_2+U^{-1}L^{-1}F_1)x=U^{-1}L^{-1}r$, where x is defined as $\Delta v$, representing a vector containing a change in voltage at circuit nodes from a previous approximation and $$r = -\left(\frac{Q(v^n)|_{t_{m+1}} - Q(v^n)|_{t_m}}{t_{m+1} - t_m} + i(v^n) + u_0\right),$$

wherein $v^n$ is a vector of voltages at the nodes, $Q(v^n)$ is charges at the nodes, $i(v^n)$ is currents at the nodes, $u_0$ represents sources in the circuit, n is an iteration number, and $t_{m+1}$ and $t_m$ are successive discrete times at which the solution is obtained for a full system.

8. The method of claim 7, wherein the subsystem is preconditioned by a projection of a preconditioner matrix I+E to form a subsystem S matrix $(I+E)|s$, a preconditioning giving:

$$((I+E)|_s)^{-1}(I+E+U^{-1}F_2+U^{-1}L^{-1}F_1)|_s x|_s = ((I+E)|_s)^{-1}(U^{-1}L^{-1})|_s.$$

9. The method of claim 7, wherein the splitting of the circuit Jacobian matrix into M+N, the replacing of $M^{-1}$ with $U^{-1}L^{-1}$ and the splitting of $U^{-1}L^{-1}N$ into the three parts are performed recursively to the subsystem matrix $(I+E)|_s$.

10. The method of claim 9, wherein preconditioning and recursions are stopped and a direct method is used to solve a final subsystem when a size of the final subsystem drops below a pre-determined threshold or when the subsystem is found to be efficient for direct solving through matrix property analysis.

11. The method of claim 1, wherein the circuit Jacobian matrix is reordered according to a set of vertex separators.

12. The method of claim 11, wherein the circuit Jacobian matrix is split into the matrices M and N by splitting out columns corresponding to the vertex separators.

13. The method of claim 12, wherein M is decomposed into an upper matrix U and a lower matrix L, wherein the preconditioning comprises using the lower matrix L to precondition M and N to form a preconditioned circuit equation.

14. The method of claim 13, wherein the preconditioned circuit equation is defined by: $L^{-1} J\Delta v=L^{-1} (M+N) \Delta v=(U+L^{-1} N) \Delta v=L^{-1}r$, wherein $\Delta v$ represents a vector containing a change in voltage at circuit nodes from a previous approximation and $$r = -\left(\frac{Q(v^n)|_{t_{m+1}} - Q(v^n)|_{t_m}}{t_{m+1} - t_m} + i(v^n) + u_0\right),$$

wherein $v^n$ is a vector of voltages at the nodes, $Q(v^n)$ is charges at the nodes, $i(v^n)$ is currents at the nodes, $u_0$ represents sources in the circuit, n is an iteration number, and $t_{m+1}$ and $t_m$ are successive discrete times at which the solution is obtained for a full system.

15. The method of claim 14, wherein the preconditioned circuit equation $(U+L^{-1}N)\Delta v=L^{-1}r$ is solved by splitting $L^{-1}N$ into a first part E and a second part $L^{-1}F$, such that $L^{-1}N=E+L^{-1}F$, wherein the first part E includes entries that are relatively big after calculation of $L^{-1}N$ and the second part F includes entries that are relatively small.

16. The method of claim 15, wherein the splitting of $L^{-1}N$ is formed during calculation of $L^{-1}N$ by comparing values of the entries.

17. The method of claim 14, wherein substitution of $E+L^{-1}F$ for $L^{-1}N$ results in a linear system to be defined by:

$$(U+E+L^{-1}F)\Delta v=L^{-1}r.$$

18. The method of claim 17, wherein the linear system to be solved is preconditioned using a preconditioner (U+E) to form a preconditioned linear system defined by:

$$(U+E)^{-1}(U+E+L^{-1}F)\Delta v=(I+(U+E)^{-1}L^{-1}F)\Delta v=(U+E)^{-1}L^{-1}r.$$

19. The method of claim 18, wherein recursively performing the steps from partitioning the circuit till obtaining a solution to $I+M^{-1}N$ to further comprises:

reordering of the circuit Jacobian matrix;

using the lower matrix L to form the preconditioned circuit equation;

splitting $L^{-1}N$ into two parts and preconditioning the linear system with the preconditioner (U+E); and solving of the preconditioned circuit equation, wherein in each recursive step, a size of the subsystem becomes smaller and a reduced subsystem is generated; and stopping recursions and applying a direct method when a size of the reduced subsystem drops below a pre-determined threshold or when the reduced subsystem is found to be efficient for direct solving through matrix property analysis.

20. The method of claim 18, wherein a Krylov-subspace iterative method is applied to a subsystem of a preconditioned linear system, the subsystem corresponding to the vertex separators.

21. The method of claim 1, wherein the combined direct and iterative solving method includes a Krylov-subspace iterative method.

22. The method of claim 1, wherein a group of all active partitions of the integrated circuit are solved together, wherein the group of all active partitions grows dynamically during each nonlinear iteration at each time step.

23. The method of claim 1, wherein the system of DAE models a static circuit operation of the integrated circuit.

24. The method of claim 1, wherein the system of DAE models a periodic or quasi-periodic steady-state operation of the integrated circuit.

25. A machine readable medium comprising a data storage device embodying a program executable instructions that when executed on a parallel computer system solves a system of differential or algebraic equations (DAE) modeling an operation of an integrated circuit using a circuit Jacobian matrix, the machine readable medium comprising:
- instructions for partitioning the circuit into loosely coupled partitions, each partition representing a subsystem of the integrated circuit,
- instructions for reordering a voltage vector and the circuit Jacobian matrix according to the partitions, the voltage vector containing values for voltages at each of a plurality of nodes;
- instructions for splitting the circuit Jacobian matrix into two matrices M and N, wherein M is a matrix suitable for parallel processing and N is a coupling matrix;
- instructions for preconditioning M and N to form a preconditioned equation having a matrix of form $I+M^{-1}N$, where I is an identity matrix having ones on a diagonal and zeros on off-diagonal positions of the identity matrix;
- instructions for obtaining a solution to $I+M^{-1}N$ in the preconditioned equation using a combined direct and iterative solving method; and
- instructions for recursively performing the steps from partitioning the circuit till obtaining a solution to $I+M^{-1}N$ to reduce sizes of subsystems of the integrated circuit.

26. The machine readable medium of claim 25, wherein instructions for obtaining the solution to $I+M^{-1}N$ comprises:
- instructions for replacing $M^{-1}$ with $U^{-1}L^{-1}$ to form a term $U^{-1}L^{-1}N$, where U is an upper triangular matrix and L is a lower triangular matrix; and
- instructions for splitting $U^{-1}L^{-1}N$ into three parts: a first part, a second part, and a third part, wherein the first part captures matrix entries that are relatively big in value, and the second and third parts capture entries that are relatively small in value during calculation.

27. The machine readable medium of claim 26, wherein the first part is a matrix E, the second part is a matrix $(LU)^{-1}F_1$, and the third part is a matrix $F_2$, such that $U^{-1}L^{-1}N=E+(LU)^{-1}F_1+F_2$.

28. The machine readable medium of claim 27, wherein:
$F_1$ is formed during a calculation of $L^{-1}N=E_0+L^{-1}F_1$; and $F_2$ is formed during a calculation of:

$$U^{-1}L^{-1}N=U^{-1}(E_0+L^{-1}F_1)=E+U^{-1}F_2+U^{-1}L^{-1}F_1.$$

29. The machine readable medium of claim 27, wherein $M^{-1}$ is given by a subsystem $(I+E+U^{-1}F_2+U^{-1}L^{-1}F_1)x=U^{-1}L^{-1}r$, where x is defined as $\Delta v$, representing a vector containing a change in voltage at circuit nodes from a previous approximation and $$r = -\left(\frac{Q(v^n)|_{t_{m+1}} - Q(v^n)|_{t_m}}{t_{m+1} - t_m} + i(v^n) + u_0\right),$$

wherein $v^n$ is a vector of voltages at the nodes, $Q(v^n)$ is charges at the nodes, $i(v^n)$ is currents at the nodes, $u_0$ represents sources in the circuit, n is an iteration number, and $t_{m+1}$ and $t_m$ are successive discrete times at which the solution is obtained for a full system.

30. The machine readable medium of claim 29, wherein the instructions for preconditioning comprise instructions for preconditioning by a projection of a preconditioner matrix $(I+E)$ to form a subsystem S matrix $(I+E)|s$, a preconditioning giving:

$$((I+E)|_s)^{-1}(I+E+U^{-1}F_2+U^{-1}L^{-1}F_1)|_s x|_s = ((I+E)|_s)^{-1}(U^{-1}L^{-1})|_s.$$

31. The machine readable medium of claim 30, further comprising instructions for recursively executing the instructions for splitting circuit Jacobian matrix into M+N, the instructions for replacing of $M^{-1}$ with $U^{-1}L^{-1}$, and the instructions for splitting $U^{-1}L^{-1}N$ into the three parts, recursions being performed to the subsystem matrix $(I+E)|_s$.

32. The machine readable medium of claim 31, further comprising:
- instructions for determining whether to stop the recursions based on at least one of a size of a reduced subsystem and a determination as to whether the reduced subsystem is efficient for direct solving, the determination being made by matrix property analysis; and
- instructions for solving the reduced subsystem by a direct solving method after stopping of the recursions.

33. The machine readable medium of claim 25, wherein the circuit Jacobian matrix is reordered according to a set of vertex separators.

34. The machine readable medium of claim 33, wherein the circuit Jacobian matrix is split into the matrices M and N by splitting out columns corresponding to the vertex separators.

35. The machine readable medium of claim 34, further comprising instructions for decomposing M into an upper matrix U and a lower matrix L, wherein the instructions for preconditioning comprises instructions for using the lower matrix L to precondition M and N to form a preconditioned circuit equation defined by: $L^{-1} J\Delta v = L^{-1}(M+N) \Delta v = (U+L^{-1}N) \Delta v = L^{-1}r$, wherein $\Delta v$ represents a vector containing a change in voltage at circuit nodes from a previous approximation and $$r = -\left(\frac{Q(v^n)|_{t_{m+1}} - Q(v^n)|_{t_m}}{t_{m+1} - t_m} + i(v^n) + u_0\right),$$

wherein $v^n$ is a vector of voltages at the nodes, $Q(v^n)$ is charges at the nodes, $i(v^n)$ is currents at the nodes, $u_0$ represents sources in the circuit, n is an iteration number, and $t_{m+1}$ and $t_m$ are successive discrete times at which the solution is obtained for a full system.

36. The machine readable medium of claim 35, further comprising instructions for solving the preconditioned circuit equation $(U+L^{-1}N)\Delta v=L^{-1}r$ by splitting $L^{-1}N$ into a first part E and a second part $L^{-1}F$, such that $L^{-1}N=E+L^{-1}F$, wherein the first part E includes entries that are relatively big after calculation of $L^{-1}N$ and the second part F includes entries that are relatively small.

37. The machine readable medium of claim 36, wherein the splitting of $L^{-1}N$ is formed during calculation of $L^{-1}N$ by comparing values of the entries.

38. The machine readable medium of claim 36, wherein substitution of $E+L^{-1}F$ for $L^{-1}N$ results in a linear system to be defined by:

$$(U+E+L^{-1}F)\Delta v=L^{-1}r.$$

39. The machine readable medium of claim 38, further comprising instructions for preconditioning the linear system to be solved using $(U+E)$ to form a preconditioned linear system defined by:

$$(U+E)^{-1}(U+E+L^{-1}F)\Delta v=(I+(U+E)^{-1}L^{-1}F)\Delta v=(U+E)^{-1}L^{-1}r.$$

40. The machine readable medium of claim 39, further comprising:

instructions for recursively executing the instructions for reordering the vector of voltages and the circuit Jacobian matrix;

instructions for using the lower matrix L to form the preconditioned circuit equation;

instructions for solving the preconditioned circuit equation;

instructions for determining whether to stop recursions based on at least one of a size of a reduced subsystem being below a pre-determined threshold and a determination as to whether the reduced subsystem is efficient for direct solving, the determination being made by matrix property analysis; and instructions for solving the reduced subsystem by a direct solving method after stopping of the recursions.

41. The machine readable medium of claim 39, wherein a Krylov-subspace iterative method is applied to a subsystem of the preconditioned linear system, the subsystem corresponding to the vertex separators.

42. The machine readable medium of claim 25, wherein the combined direct and iterative solving method includes a Krylov-subspace iterative method.

43. The machine readable medium of claim 25, wherein a group of all active partitions of the integrated circuit are solved together, wherein the group of all active partitions can grow dynamically during each nonlinear iteration at each time step.

44. The machine readable medium of claim 25, wherein the system of DAE models a periodic or quasi-periodic steady-state operation of the integrated circuit.

45. The machine readable medium of claim 25, wherein the system of DAE models a static circuit operation of the integrated circuit.

* * * * *

UNITED STATES PATENT AND TRADEMARK OFFICE
CERTIFICATE OF CORRECTION

PATENT NO. : 7,783,465 B2
APPLICATION NO. : 11/612335
DATED : August 24, 2010
INVENTOR(S) : Baolin Yang It is certified that error appears in the above-identified patent and that said Letters Patent is hereby corrected as shown below:

Column 14
Line 40, amend "foLm" to --form--.

Column 15
Line 20, amend

" $U^{1}L^{-1}N=U^{1}(E_{0}+L^{-1}F_{1})=E+U^{1}F_{2}U^{1}L^{-1}F_{1}$ "

to

-- $U^{1}L^{-1}N=U^{1}(E_{0}+L^{-1}F_{1})=E+U^{1}F_{2}+U^{1}L^{-1}F_{1}$ --.

Line 46, amend "the" to --a--.

Column 17
Line 43, amend

" $U^{1}L^{-1}N=U^{1}(E_{0}+L^{-1}F_{1})=E+U^{1}F_{2}+UL^{-1}F_{1}$ "

to

-- $U^{1}L^{-1}N=U^{1}(E_{0}+L^{-1}F_{1})=E+U^{1}F_{2}+U^{1}L^{-1}F_{1}$ --.

Column 18
Line 66, amend

" $(U+E)^{-1}(U+E+L^{-1}F)\Delta v=(I+(U+E)^{-1}L^{-1}F)\Delta v=(U+E)^{-1}L^{-1}r$ "

to

-- $(U+E)^{-1}(U+E+L^{-1}F)\Delta v=(I+(U+E)^{-1}L^{-1}F)\Delta v=(U+E)^{-1}L^{-1}r$ --.

Signed and Sealed this
Thirty-first Day of January, 2012

David J. Kappos
*Director of the United States Patent and Trademark Office*